(12) United States Patent
Lee et al.

(10) Patent No.: US 10,394,516 B2
(45) Date of Patent: Aug. 27, 2019

(54) MOBILE TERMINAL AND METHOD FOR CONTROLLING SOUND OUTPUT

(71) Applicant: Pantech Inc., Seoul (KR)

(72) Inventors: Yong Il Lee, Seoul (KR); Young Jun Kang, Seoul (KR); Jae Woo Hwang, Seoul (KR)

(73) Assignee: Pantech Inc., Seoul (KR)

(*) Notice: Subject to any disclaimer, the term of this patent is extended or adjusted under 35 U.S.C. 154(b) by 418 days.

(21) Appl. No.: 15/225,314

(22) Filed: Aug. 1, 2016

(65) Prior Publication Data
US 2016/0342384 A1 Nov. 24, 2016

Related U.S. Application Data

(63) Continuation of application No. 14/039,160, filed on Sep. 27, 2013, now Pat. No. 9,407,223.

(30) Foreign Application Priority Data
Sep. 28, 2012 (KR) .................. 10-2012-0108865

(51) Int. Cl.
H03G 3/20 (2006.01)
G06F 3/16 (2006.01)
(Continued)

(52) U.S. Cl.
CPC ............ G06F 3/165 (2013.01); G06F 3/0482 (2013.01); G06F 16/68 (2019.01); H03G 3/20 (2013.01);
(Continued)

(58) Field of Classification Search
None
See application file for complete search history.

(56) References Cited

U.S. PATENT DOCUMENTS 6,674,451 B1 * 1/2004 Fado .................. G06F 3/16
381/93
7,706,903 B2 * 4/2010 Champion ............. H03G 3/02
700/94

(Continued)

FOREIGN PATENT DOCUMENTS

KR 10-2007-0067425 6/2007
KR 10-2011-0129335 12/2011

OTHER PUBLICATIONS

Non-Final Office Action dated Aug. 7, 2015 in U.S. Appl. No. 14/039,160.

(Continued)

Primary Examiner — Peter Vincent Agustin
(74) Attorney, Agent, or Firm — H.C. Park & Associates, PLC

(57) ABSTRACT

Provided is a mobile terminal and method for controlling a sound (audio) to be output, the mobile terminal including at least one application including sound (audio) data and requesting an output sound, a sound (audio) control unit to determine an output sound when a plurality of requests for the output sound is input by a plurality of applications being executed, and a sound (audio) output unit to output the determined sound by forming a virtual output path for each of the sound data to be output, and blocking other virtual output paths aside from a virtual output path mapped to the sound determined to be output by the sound control unit.

16 Claims, 9 Drawing Sheets

(51) Int. Cl.
*G06F 16/68* (2019.01)
*H03G 3/30* (2006.01)
*G06F 3/0482* (2013.01)

(52) U.S. Cl.
CPC ......... *H03G 3/3005* (2013.01); *H03G 3/3089* (2013.01)

(56) References Cited

U.S. PATENT DOCUMENTS

| | | | | |
|---|---|---|---|---|
| 8,768,494 | B1* | 7/2014 | Stroud | H04S 7/30 |
| | | | | 700/94 |
| 9,407,223 | B2* | 8/2016 | Lee, II | H03G 3/3005 |
| 2005/0227740 | A1* | 10/2005 | Orbach | H04M 1/642 |
| | | | | 455/567 |
| 2007/0025335 | A1* | 2/2007 | Patel | G06F 9/451 |
| | | | | 370/352 |
| 2007/0244586 | A1* | 10/2007 | Champion | G06F 3/165 |
| | | | | 700/94 |
| 2008/0091851 | A1* | 4/2008 | Sierra | G06F 3/16 |
| | | | | 710/22 |
| 2011/0085679 | A1* | 4/2011 | Jakes | H03G 3/342 |
| | | | | 381/107 |
| 2011/0283191 | A1* | 11/2011 | Maki | G06F 3/165 |
| | | | | 715/716 |
| 2012/0110196 | A1* | 5/2012 | Balasaygun | H04L 12/1818 |
| | | | | 709/228 |
| 2014/0093101 | A1* | 4/2014 | Lee, II | H03G 3/3005 |
| | | | | 381/107 |
| 2014/0109003 | A1* | 4/2014 | Saib | G06F 3/0482 |
| | | | | 715/808 |
| 2016/0342384 | A1* | 11/2016 | Lee, II | H03G 3/3005 |

OTHER PUBLICATIONS

Non-Final Office Action dated Dec. 10, 2015 in U.S. Appl. No. 14/039,160.

Notice of Allowance dated Mar. 25, 2016 in U.S. Appl. No. 14/039,160.

* cited by examiner

MOBILE TERMINAL AND METHOD FOR CONTROLLING SOUND OUTPUT

CROSS-REFERENCE TO RELATED APPLICATION

This application is a continuation of U.S. patent application Ser. No. 14/039,160, filed on Sep. 27, 2013, and claims priority from and the benefit under 35 U.S.C. § 119(a) of Korean Patent Application No. 10-2012-0108865, filed on Sep. 28, 2012, which is hereby incorporated by reference in its entirety for all purposes as if fully set forth herein.

BACKGROUND

Field

Exemplary embodiments of the present invention relate to a mobile terminal and method for controlling a sound or audio to be output by the mobile terminal.

Discussion of the Background

Generally, when playing a sound (which may also be referred to as audio hereinafter) with a music application on a mobile terminal while playing multimedia through another application or program, two sounds are output simultaneously or concurrently. Accordingly, a user of the mobile terminal may experience inconvenience since the two overlapping sounds may pose a hindrance to the user intending to listen to a desired sound.

The user is required to search for an application or a program playing an unwanted sound in order to stop operating the application so that a desired sound may be heard. The unwanted sound is stopped when sound settings are changed by accessing the application playing the unwanted sound.

Accordingly, there is a need for technology for resolving the inconvenience of having to individually change the sound settings by searching for an application or a program playing a sound.

SUMMARY

The present disclosure is directed to providing a method for controlling an output sound by a mobile terminal.

According to exemplary embodiments, there is provided a mobile terminal to control an output sound, the mobile terminal including: a sound control unit configured to form a virtual output path for applications requesting to output sound data and configured to determine sound data to be output selected from each application's sound data; a sound output unit to output the determined sound data by muting the virtual output paths not mapped to the determined sound data; and a sound hardware controlled by the sound output unit.

According to exemplary embodiments, there is provided a computer-implemented method for controlling output sound, the method including: forming a virtual output path for applications requesting to output sound data; determining, with the computer, sound data to be output selected from each application's sound data; and outputting, with the computer, the determined sound data by muting the virtual output paths not mapped to the determined sound data.

According to exemplary embodiments, there is provided a non-transitory readable storage that, when executed by a terminal comprising a display and one or more processors, causes the one or more processors to perform operations to control output sound of the terminal, the method including: forming a virtual output path for applications requesting to output sound data; determining, with the computer, sound data to be output selected from sound data of the applications; and outputting, with the computer, the determined sound data by muting the virtual output paths not mapped to the determined sound data. Additional features of the invention will be set forth in the description that follows, and in part will be apparent from the description, or may be learned by practice of the invention.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
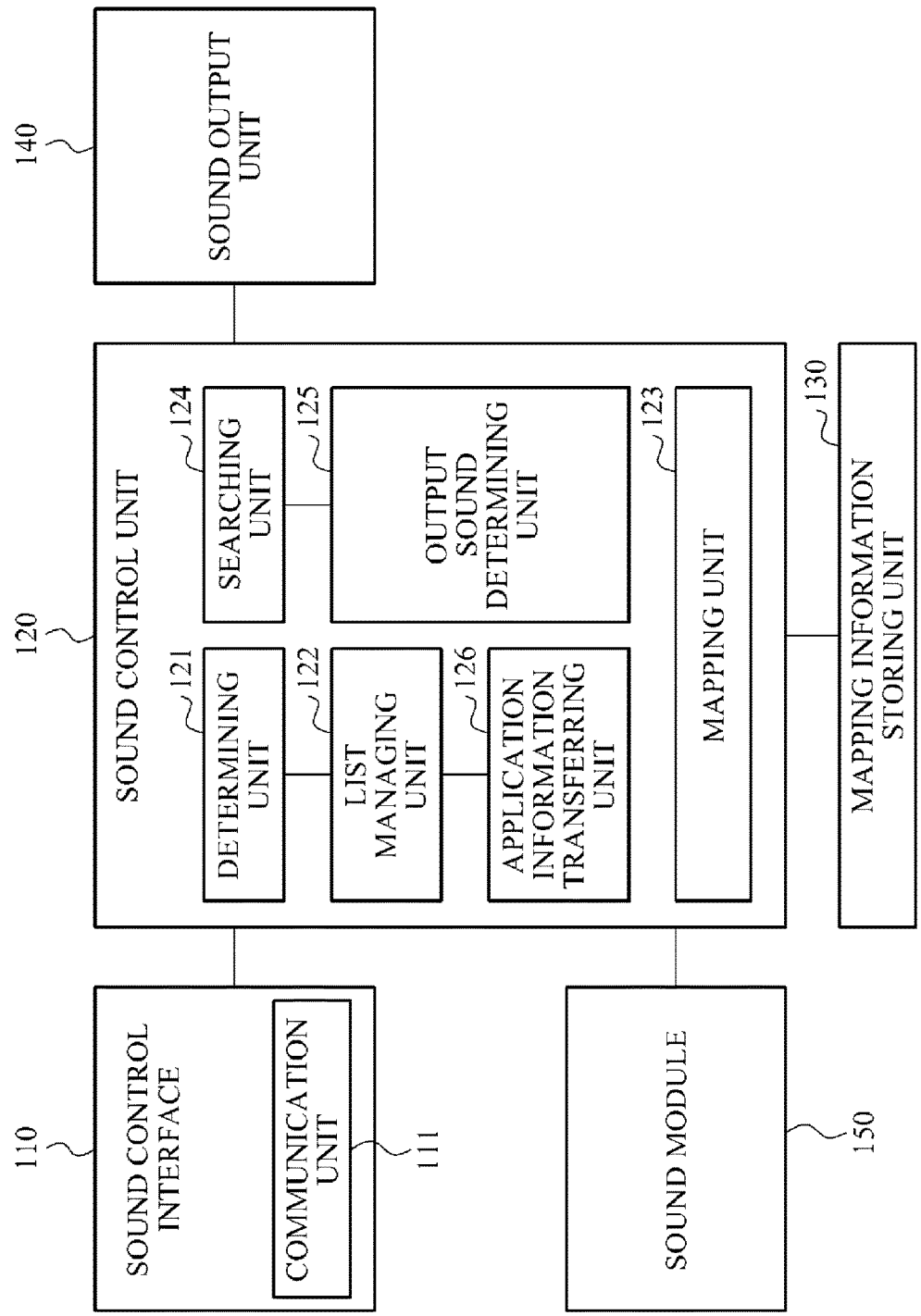
FIG. 1 illustrates a mobile terminal including a sound control unit to control a sound or audio to be output according to exemplary embodiments of the present invention.

The following description is provided to assist the reader in gaining a comprehensive understanding of the methods, apparatuses, and/or systems described herein. Accordingly, various changes, modifications, and equivalents of the methods, apparatuses, and/or systems described herein will suggest themselves to those of ordinary skill in the art. In addition, descriptions of well-known functions, operations, and constructions may be omitted for increased clarity and conciseness.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Throughout the drawings and the detailed description, unless otherwise described, the same drawing reference numerals are understood to refer to the same elements, features, and structures. The relative size and depiction of these elements may be exaggerated for clarity.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first," "second," and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

In addition, embodiments described in the specification are wholly hardware, and may be partially software or wholly software. In the specification, "unit", "module", "device", "system", or the like represents a computer related entity such as hardware, combination of hardware and software, or software. For example, in the specification, the unit, the module, the device, the system, or the like may be an executed process, a processor, an object, an executable file, a thread of execution, a program, and/or a computer, but are not limited thereto. For example, both of an application which is being executed in the computer and a computer may correspond to the unit, the module, the device, the system, or the like in the specification.

It will be understood that when an element is referred to as being "connected to" another element, it can be directly connected to the other element, or intervening elements may be present.

Generally, a mobile device may include a hardware layer, a platform to process a signal input from the hardware layer and transfer the signal, and an application program layer based on the platform, which is operated and configured by various application programs.

The platform may be classified into an ANDROID platform, a WINDOWS mobile platform, an IOPERATING SYSTEM (iOS) platform, and the like, and despite a distinct structure of each of the platforms, a basic function or operation may be identical to each other.

The ANDROID platform may manage hardware, transfer a request for an application program to the hardware, and include a Linux kernel layer to transfer a response from the hardware to the application program, a framework layer to manage a variety of application programs, and a library layer to connect the hardware and the framework layers. One or more of the layers may be configured by or in C or C++, for example, the library layer.

A WINDOWS core layer of the WINDOWS mobile platform may correspond to the LINUX kernel layer, and include an interface layer to connect the WINDOWS core layer and the application program layer and to support various languages or functions.

A core OS layer of the IOS platform may correspond to the LINUX kernel layer, and a core service layer of the IOS platform may be similar to the library layer and the framework layer. In addition, the IOS platform may include a media layer to provide a multimedia function or operation and a COCOA touch layer for various application programs.

As used herein, "layers" may refer to a block, and the framework layer and a corresponding layer may be defined as software blocks. Although the ANDROID platform may be presented as an example in exemplary embodiments of the present invention, exemplary embodiments of the present invention may be implemented in all of the aforementioned platforms of mobile devices, and may not be limited thereto.

FIG. 1 illustrates a mobile terminal for controlling an output sound according to exemplary embodiments of the present invention. The mobile terminal for controlling the output sound may include a sound (audio) control interface 110, a sound (audio) control unit 120, a mapping information storing unit 130, and a sound (audio) output unit 140.

When a plurality of sounds is played, the sound control interface 110 may output a list of or information identifying applications playing the plurality of sounds to a screen of a terminal. As used herein, an "application" may refer to an application program, and may include various application programs operated on a terminal. Application programs playing a sound may include a variety of sound playback programs, such as, a digital multimedia broadcasting (DMB) reproducing program, a multimedia reproducing program, a game, a web browser, and the like.

When a plurality of sounds is output simultaneously or concurrently, such that they overlap, the sound control interface 110 may provide a list of or information identifying corresponding applications to a user. For example, the sound control interface 110 may output a list of applications to a screen of a terminal in a form of a pop-up. The sound control unit 120 may determine whether multiple audio or sound applications are being concurrently executed. The sound control interface 110 may receive, for example, from the sound control unit 120, information about the plurality of sounds being output simultaneously or concurrently to output the information onto a screen.

A user may set a priority for each of the applications through the sound control interface 110. To this end, the sound control interface 110 may provide a menu for setting a priority for each of the applications. The priority for each of the applications may be set among a total of applications playing a sound, or among applications playing music. For example, the priority may be set for YOUTUBE, an application for playing DMB or a television (TV), and a music player. The priority may be set for predetermined music playing applications, such as, BUGS or MELON. In some embodiments, the priorities for playing a sound for such applications may have a lower priority than a priority for making a telephone call.

The sound control interface 110 may include a communication unit 111. When an application playing a sound is executed on a terminal, the communication unit 111 may transfer an application identifier of the application to the sound control unit 120. As used herein, the "application" may indicate an application playing at least one of a video and a sound, such as, multimedia, a game, a video player of a web browser, and the like. The communication unit 111 may transfer the application identifier to the sound control unit 120. Hereinafter, a name of an application will be used as an example of the application identifier.

The communication unit 111 may receive information indicating that a plurality of sounds is played, from the sound control unit 120. The information indicating that the plurality of sounds is played may be information about a name of an application being executed. The communication unit 111 may transfer the name of one or more applications selected by the user from among the applications being executed.

The mobile terminal for controlling the output sound may include a sound (audio) module 150. The sound module 150 may transfer, for example, to the sound control unit 120, a request for an output sound from an application being executed, decode the sound data input from the application, and transfer the decoded sound data to the sound control unit 120.

The sound control unit 120 may determine an output sound from a terminal from among applications playing a sound, based on a selection from a user input through the sound control interface 110. The sound control unit 120 may include a determining unit 121, a list managing unit 122, an application information transferring unit 126, a mapping unit 123, a searching unit 124, and an output sound (audio) determining unit 125.

When an application, hereinafter referred to as an application A, playing a sound on a terminal is being executed, the determining unit 121 may determine whether another different application, hereinafter referred to as an application B, is already being executed. The determining unit 121 may determine that application B is being executed by verifying whether application B is registered in the mapping information storing unit 130. The determining unit 121 may verify whether a name of application B is registered in the mapping information storing unit 130. When application B is not being executed, the determining unit 121 may determine that application A is being executed independently.

When applications are being executed, the list managing unit 122 may transfer a list of applications being executed to the sound control interface 110. When application B is being executed, the list managing unit 122 may create a list including a name of application A and a name of application B, and transfer the list to the sound control interface 110. When application A is executed and application B is not being executed, the list managing unit 122 may operate without controlling an output sound.

The mapping unit 123 may map a name of an application, based on information about a sound being played in the application, with an index of a soundtrack. The soundtrack may include decoded information about a sound being played in an application. The index for each soundtrack may be set in order to map the decoded information and the name of the application. The index of the soundtrack may indicate a number. For example, the mapping unit 123 may map the name of the application A with an index entry of 1 for a particular soundtrack. The soundtrack may include information about a sound being played in application A. The mapping unit 123 may map the name of application B with an index entry of 2 for the soundtrack. The soundtrack may include information about a sound being played in application B.

The sound control unit 120 may distinguish a sound being played for each application using an index of a soundtrack mapped with a name of an application. The sound control unit 120 may store a result of the mapping of the name of the application and the index of the soundtrack in the mapping information storing unit 130.

The searching unit 124 may search for an index of a soundtrack matching a name of an application, based on an application selected by the user. Although the searching unit 124 may search for an index of a soundtrack matching the name of the application selected from information stored in the mapping information storing unit 130, the mapping information storing unit 130 may not be provided separately.

The output sound determining unit 125 may form a virtual output path through which a sound is to be output for each application by referring to a sound index mapped by the mapping unit 123 for each application. In the case of a music application, since a sound is playing music, a point of playing a sound may be predetermined. However, when a sound is played by accidently activating contents, for example, playing a sound while searching in a web browser, and the like, determining an accurate point of playing a sound may be difficult. Accordingly, when a sound played from an application is difficult to control, a virtual output path may be formed and managed for each application playing a sound. The virtual path can allow a sound of an application selected by a user to be played.

The output sound determining unit 125 may control a sound that is selected by the user to be output from a terminal by muting other virtual output paths, aside from a virtual output path of the application selected by the user, from among virtual output paths formed for each of applications playing a sound.

For example, the output sound determining unit 125 may determine a sound included in a soundtrack matching an index of a soundtrack found in the searching unit 124 to be an output sound from a terminal, based on a selection from the user. When the user selects a single application, the output sound determining unit 125 may block virtual output paths of other applications aside from a virtual output path corresponding to the application selected by the user. In some embodiments, when a user selects a plurality of applications, the output sound determining unit 125 may maintain virtual output paths corresponding to the selected applications, and block the virtual output paths of the other applications. When the user selects a sound to be played in the plurality of applications, a total of sounds may be output from the plurality of applications selected by the user, and the virtual output path selected by the output sound determining unit 125 may be connected to a sound (audio) output unit 140.

In some exemplary embodiments, the searching unit 124 may search for the index of the soundtrack matching the name of the application selected by the user. In some embodiments, the searching unit 124 may search for an index of a soundtrack matching a name of an application unselected by the user. The output sound determining unit 125 may determine a sound included in the soundtrack matching the index found in the searching unit 124 to be a sound not to be output from a terminal. In this instance, the output sound determining unit 125 may suspend outputting a sound of an application unselected by the user by muting a virtual output path matching an index found in the searching unit 124.

The mapping information storing unit 130 may store a table in which an application identifier for playing a sound or video is mapped with an index of a soundtrack, or the index of the soundtrack mapped with the application identifier. The mapping information storing unit 130 may register an application identifier being executed and an index of a corresponding soundtrack, based on a control. The application identifier may indicate a name of an application and a name of a package.

In some embodiments, the mapping information storing unit 130 may store information about a priority for executing an application set in the sound control interface 110. The sound control unit 120 may determine an output sound from a terminal without user input by loading the priority information from the mapping information storing unit 130.

The sound control unit 120 may determine a sound played in a most recently executed application that outputted a sound. For example, when application B was most recently executed and application A is playing a sound being executed while application B is playing another sound, the sound control unit 120 may end an execution of application A, and determine that the sound being played in application B should be output from the terminal. In some embodiments, the sound control unit 120 may control a virtual output path by connecting the soundtrack mapped with the name of application B to the sound output unit 140.

In some embodiments, the sound control unit 120 may control a sound played in a selected application based on a priority from the terminal. The selected application may be selected to output sound through the sound control interface 110. The sound control unit 120 may suspend other sounds from the unselected application, and the other sounds may be automatically suspended by the sound control unit 120. The application with the priority may be a single application. The priority among the plurality of applications may be set based on a settings order of the user.

When an inactive setting is input through the sound control interface 110 due to an absence of any additional selection from the user, the sound control unit 120 may determine a total of sounds played through the plurality of applications to be sounds to be output from the terminal.

The sound output unit 140 may output a sound based on sound data transferred from the sound control unit 120. The sound output unit 140 may output, from the terminal, the sound data transferred through the virtual output path selected to maintain in the sound control unit 120. The sound output unit 140 may include hardware, such as, a driver related to hardware codec or sound processing, a speaker, and the like.

In some embodiments, the sound control unit 120 may include an application information transferring unit 127.

When an application playing a sound, application A, is executed on a terminal, the determining unit 121 may determine whether an application playing a sound, application B, is already being executed. The determining unit 121 may determine whether application B is playing a sound different from the sound being played by application A by verifying whether application B is registered in the mapping information storing unit 130. In some embodiments, the determining unit 121 may verify whether names of the applications, such as, application A, application B, or an application C, playing another sound are registered in the mapping information storing unit 130. Accordingly, the sound control unit 120 may distinguish each of the applications through the determining unit 121 although a plurality of sounds is played simultaneously. When applications B or C are not being executed, the determining unit 121 may determine that application A is being executed independently.

The application information transferring unit 127 may transfer the names of applications A and B to the sound control interface 110 when application B playing the sound is different from the sound of application A being presently executed. In some embodiments, the application information transferring unit 127 may transfer a name of an application package A and a name of an application package B to the sound control interface 110 for use as application identifier. As used here, a "name of an application package" may refer to an invariable unique name assigned by an application creator, and can operate as an identifier to distinguish various applications and/or application packages.

The sound control unit 120 may control the sound or audio output of a mobile terminal. In some embodiments, the sound control unit 120 may operate as the sound control interface 110, a mapping information storing unit 130, and a sound output unit 140. The exemplary embodiment of FIG. 1 illustrates configurations of each component of a mobile terminal for controlling an output sound separately to distinguish each function or operation of the configurations. When embodying an actual product, all functions or operations associated with controlling a sound may be configured to be processed in the sound control unit 120. In some embodiments, a portion of functions or operations associated with controlling a sound may be processed in the sound control unit 120.

Figure 2:
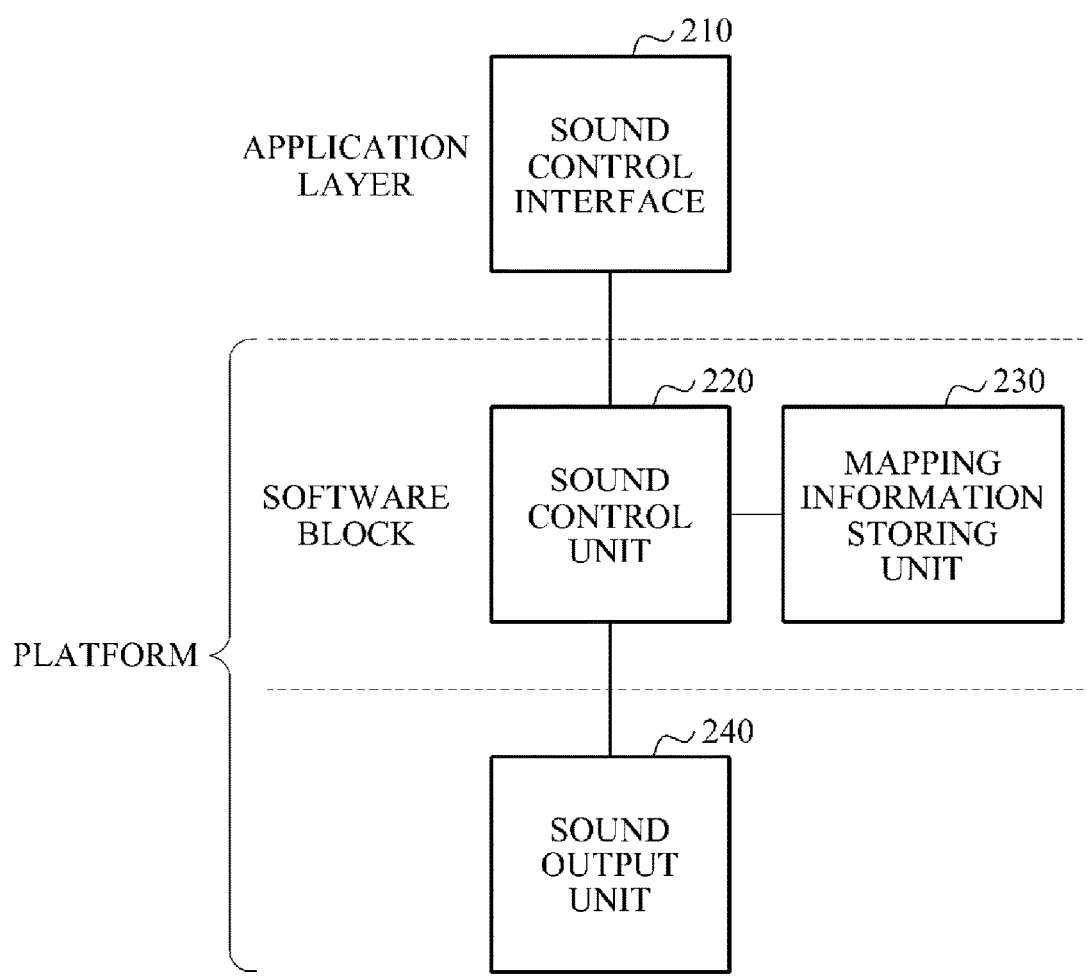
FIG. 2 illustrates a relationship between a mobile terminal operating system and a configuration to control a sound or audio to be output according to exemplary embodiments of the present invention.

FIG. 2 illustrates a relationship between a mobile terminal operating system and a configuration for controlling an output sound according to exemplary embodiments of the present invention. A sound (audio) control interface 210 may be located in an application layer of a mobile operating system (OS) including several layers. The application layer may refer to a portion where various application programs used in a terminal are operated/executed.

When a plurality of sounds is played by executing applications, the sound control interface 210 may output a list of applications playing the plurality of sounds. The sound control interface 210 may transfer the list or application information to a sound (audio) control unit 220.

The sound control unit 220, and a mapping information storing unit 230, and a sound (audio) output unit 240 may be located on a platform. The sound control unit 220 and the mapping information storing unit 230 may be located in a software block, and the sound output unit 240 may be located on the platform or hardware layer. The software block may indicate a portion in which configurations for implementing an operation required for managing various application programs are located.

The sound control unit 220 may determine a sound played in an application selected by a user from applications playing a sound in conjunction with the sound control interface 210.

The mapping information storing unit 230 may map an application identifier, an index of a soundtrack to store the application identifier, and the index of the soundtrack mapped. The mapping information storing unit 230 may register an application identifier being executed based on a control of the sound control unit 220 and an index of a corresponding soundtrack when an application playing a sound is executed.

The sound output unit 240 may output a sound from a terminal based on sound data transferred from the sound control unit 220.

Figure 3:
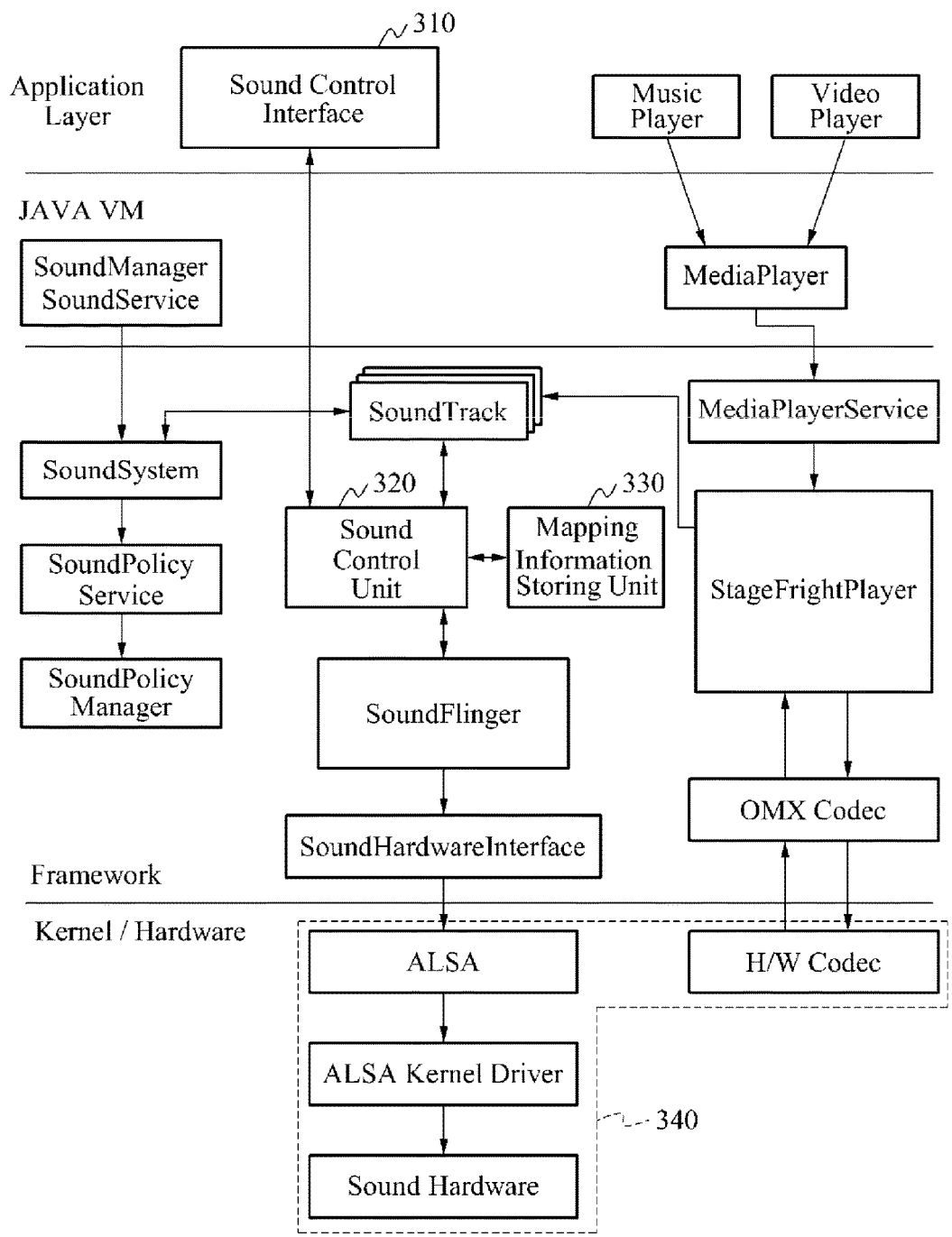
FIG. 3 illustrates a configuration to control an output sound, for example, in an ANDROID-based operating system (OS).

FIG. 3 illustrates a configuration to control a sound to be output, for example, in an ANDROID-based OS. A sound (audio) control interface 310 may be located on an application layer. The sound control interface 310 may be displayed in a form of an application.

A sound (audio) control unit 320 may be located in a framework layer. The sound control unit 320 may control an output sound from a terminal in conjunction with the sound control interface 310 when a plurality of sounds is played. A mapping information storing unit 330 may be located in the framework layer. The mapping information storing unit 330 may operate in conjunction with the sound control unit 320. A sound output unit 340 may be dispersed over the kernel layer and the hardware layer. The sound output unit 340 may include hardware, such as, a driver related to a hardware codec or sound processing, a speaker, and the like.

Each configuration for a sound control system illustrated in FIG. 3 has a configuration identical to the exemplary embodiments described earlier, despite being illustrated with different reference numerals for ease of convenience. Repeat descriptions may be omitted.

Hereinafter, each operation of configurations for controlling a sound to be played when sounds are played, for example, in the ANDROID-based OS, will be described with reference to FIG. 3 and FIG. 4.

When applications, such as, a music player and a video player, able to play a sound are executed, a media player in JAVA Virtual Machine (VM) may request multimedia contents to be played through a media player service.

For example, the media engine of an ANDROID OS, STAGEFRIGHT, may analyze the media and request a corresponding codec to decode the media.

For example, an OMX Codec may call and decode a hardware (H/W) codec or a software (S/W) codec required for the corresponding media. The decoded data may be transferred to a soundtrack.

A sound policy service and a sound policy manager by which the soundtrack is output and a device through which the soundtrack is output may be determined. The "device" may refer to, for example, a headset, a Bluetooth device, a speaker, and the like. The sound policy service and the sound policy manager may be managed by a sound manager service.

The decoded data may be transferred to the sound control unit 420 through the soundtrack, and the decoded data may be stored in a shared buffer of a software configuration management (SCM) for each soundtrack.

The sound control unit 320 may generate a virtual sound (audio) path with respect to a soundtrack of a soundtrack index matched to a name of an application selected by a user, and transfer sound data to a sound mixer, for example, the Sound Flinger of ANDROID, through the generated virtual sound output path.

The Sound Flinger may mix a plurality of sound (audio) data input. The plurality of sound data mixed may be transferred to an advanced Linux sound architecture (ALSA) through a sound (audio) hardware interface. The sound transferred to the ALSA may be output to sound hardware, such as, a speaker or an earphone through an ALSA kernel driver.

As the Sound Flinger may mix the plurality of sound data input rather than separate and output the plurality of sounds, in the present invention, the sound control unit 320 may determine the data to be output from the terminal from among the plurality of sound data prior to data being transferred to the Sound Flinger. This process will be further described hereinafter.

Figure 4:
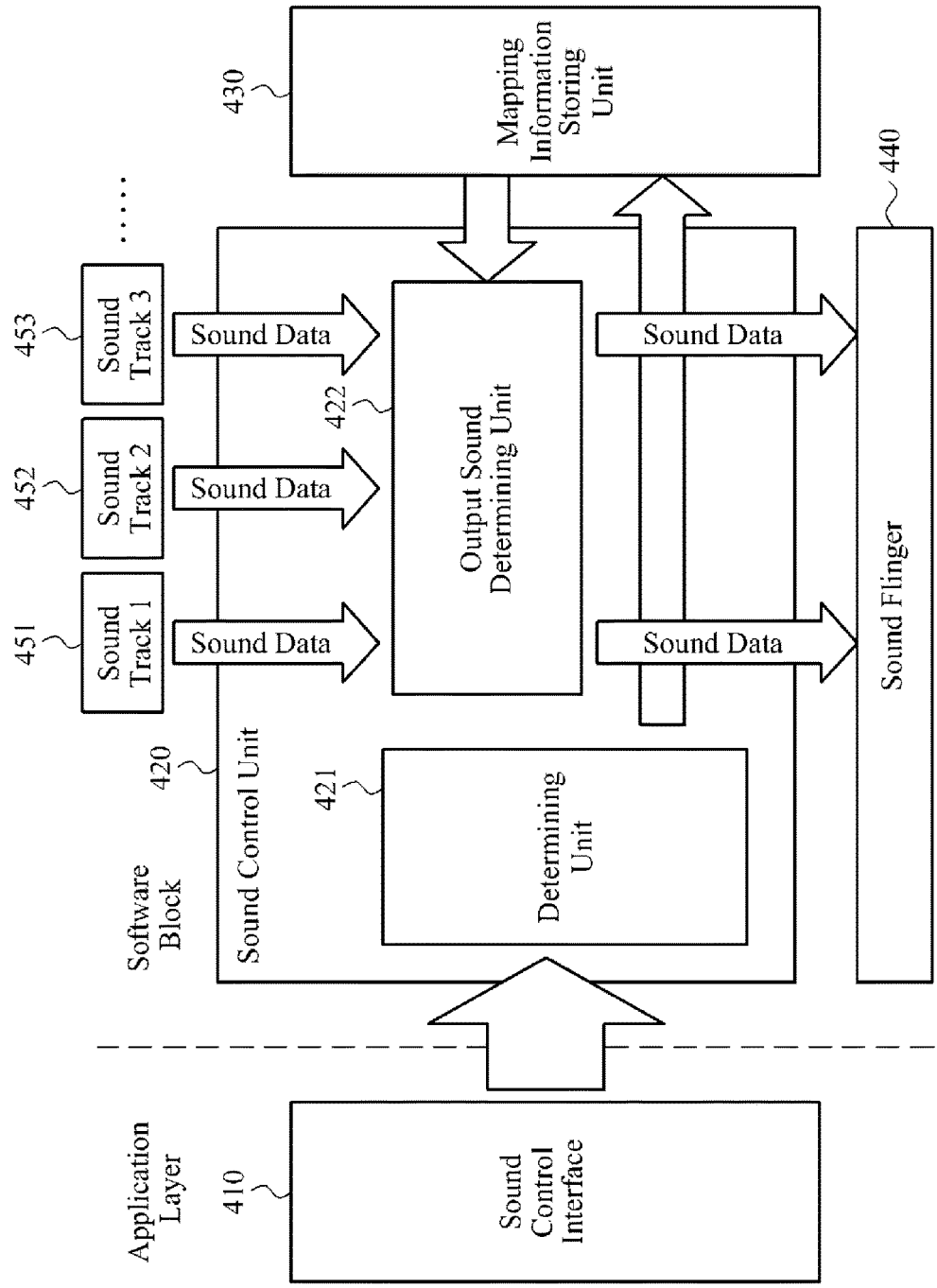
FIG. 4 illustrates an operation of the configuration of FIG. 3 to control an output sound.

FIG. 4 illustrates an operation of the configuration of FIG. 3 to control an output sound. When a plurality of sounds is played by a plurality of applications being executed, the sound (audio) control interface 410 may transfer information about the plurality of applications playing the plurality of sounds. A user may select a sound of a desired application to be played, via the sound control interface 410.

When a plurality of sounds is played, a plurality of soundtracks 451, 452, and 453 may exist. Each of the plurality of soundtracks 451, 452, and 453 may be transferred to the sound (audio) control unit 420, and the transferred sound data may be mapped on the generated virtual output path, subsequent to a virtual output path being generated in an output sound (audio) determining unit 422 for each of the sound data.

A determining unit 421 may search for an index of a soundtrack matched to a name of an application selected from a user in the mapping information storing unit 430, and transfer the index of the soundtrack to the output sound determining unit 422.

The output sound determining unit 422 may control a virtual output path matched to the plurality of soundtracks 451, 452, and 453. For example, when the user selects two applications, the output sound determining unit 422 may maintain virtual output paths corresponding to the two applications selected, and mute a virtual output path corresponding to an application unselected. Subsequently, sound data played in the two applications selected by the user may be input to the Sound Flinger through the virtual output paths, and the Sound Flinger 440 may output a sound played in the two applications finally selected by the user by mixing two pieces of sound data.

Referring to FIGS. 5 to 8, an exemplary embodiment of a sound control interface according to an exemplary embodiment of the present invention will be described.

Figure 5:
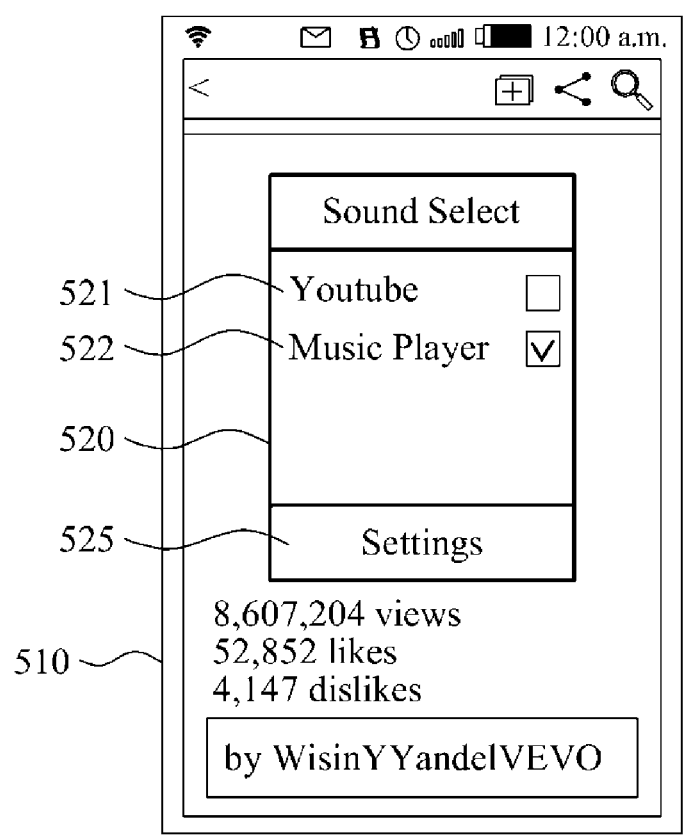
FIG. 5 illustrates a sound control interface according to exemplary embodiments of the present invention.

FIG. 5 illustrates a sound control interface according to exemplary embodiments of the present invention. When a plurality of sounds is played, the sound control interface (not shown) may output a list of applications 521 and 522 playing a plurality of sounds in a form of a pop-up on a screen 510 of a terminal. The sound control interface may be an application, for example, as an independent application. The sound control interface may provide a user selection menu in the form of the pop-up as shown in FIG. 5. The user may select the application 522 to output a sound (indicating by checking the selection box) from among the plurality of applications 521 and 522. The plurality of applications 521 and 522 may include a video playing application, such as, YouTube 521, a music playing application, such as, a music player 522, a sound playing program on a webpage, and the like. In some embodiments, the sound control interface may be a service.

A sound output for each additional application may be set by accessing a settings menu 525 on a list 520.

Figure 6:
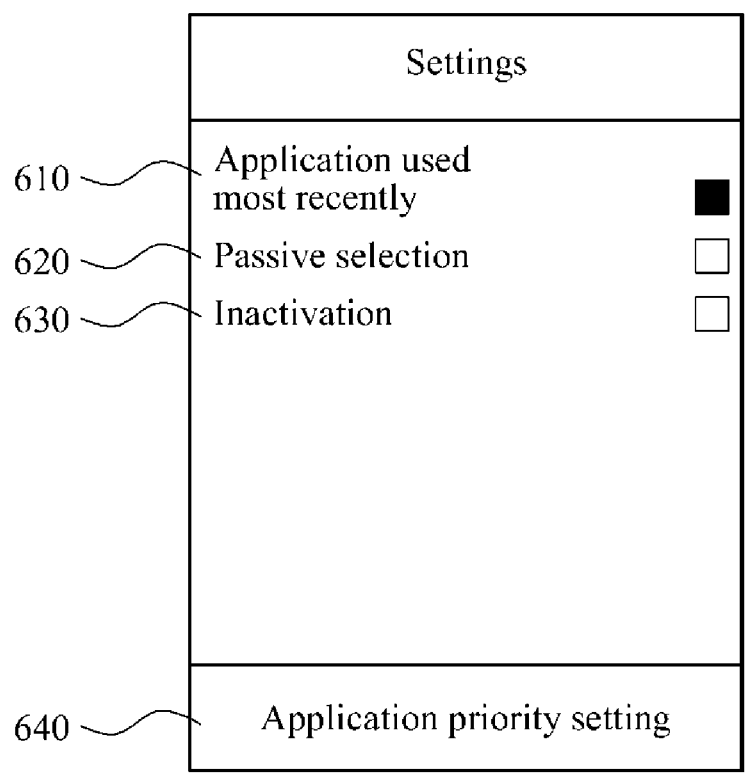
FIG. 6 illustrates a detail settings menu of the sound control interface of FIG. 5.

FIG. 6 illustrates a detail settings menu of the sound control interface of FIG. 5. The settings menu 525 may display an entry for application executed most recently 610, an entry for a passive selection 620, an entry for inactivation 630, and an entry for application priority settings 640.

When the entry for an application used most recently 610 is checked, a sound of an application used most recently is output from a terminal, and when the entry for the passive selection 620 is checked, a sound of an application selected from the user may be output.

When the user checks the entry for the inactivation 630, or when any of the entry for application used most recently 610, and the entry for the passive selection 620 is unselected, a sound may fail to be output selectively, and a total of sounds played in the applications being executed may be output.

The user may set a priority among applications able to play a sound through the entry for the application priority settings 640.

Figure 7:
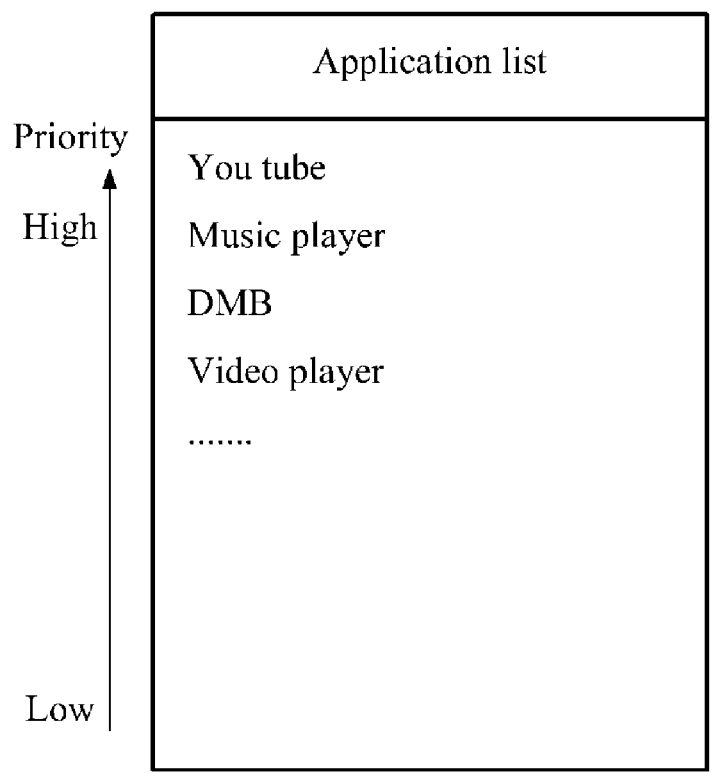
FIG. 7 illustrates an execution order of an application based on a priority set in a sound control interface according to FIG. 5 of the present invention.

FIG. 7 illustrates an execution order of an application based on a priority set in a sound control interface according to FIG. 5 of the present invention. When the entry for application priority setting 640 is selected, a list of applications able to play a sound may be output on a screen of a terminal.

A user may set a higher priority to an application selected by moving an application desired to an upper portion of the screen. In some embodiments, priority of an application located higher on the screen may be set higher than a priority of an application located lower on the screen. In some embodiments, an application currently displayed or in the foreground can be given higher priority. For example, a music player application in the foreground can be given a greater priority than other background applications. In some embodiments, the applications can be prioritized based on their frequency of use. For example, applications used more often can be given higher priority. A reverse setting for any of these embodiments may also be possible.

Figure 8:
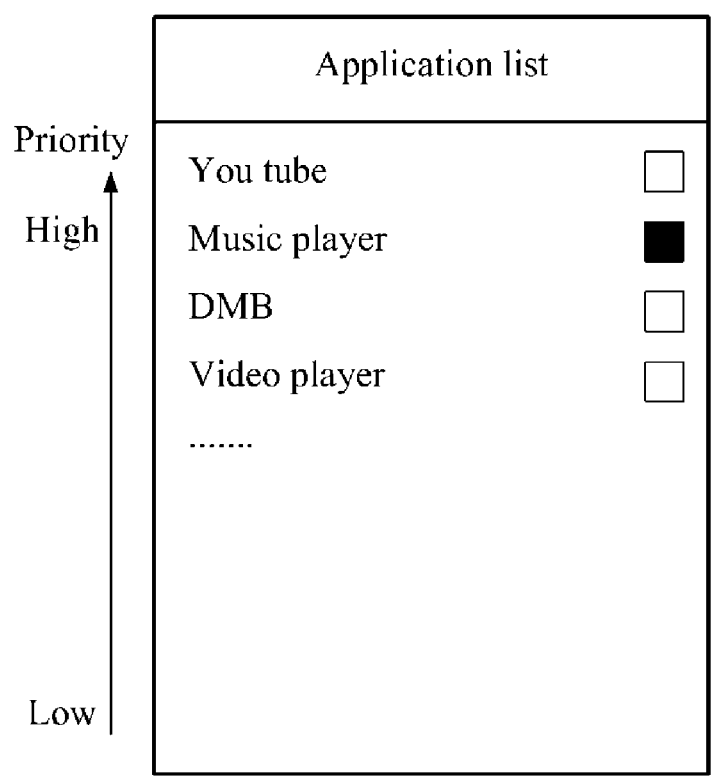
FIG. 8 illustrates setting a priority of an application in the sound control interface of FIG. 5.

FIG. 8 illustrates setting a priority of an application in the sound control interface of FIG. 5. A user may set a priority for sound playing to only one of predetermined applications on a screen provided with an application list.

When one of the entries indicating each of the applications is checked, a sound played in the checked application may be output. For example, when an entry for the music player is checked, a sound played by the music player may be output through a mobile terminal although one of the other sound (audio) applications, for example, YouTube, DMB, or video player, is being concurrently or simultaneously executed in the mobile terminal.

A method for controlling an output sound of a mobile terminal with reference to FIG. 9 will be described, as exemplary embodiments of the present invention have been set forth in detail with reference to FIGS. 1 to 8.

Figure 9:
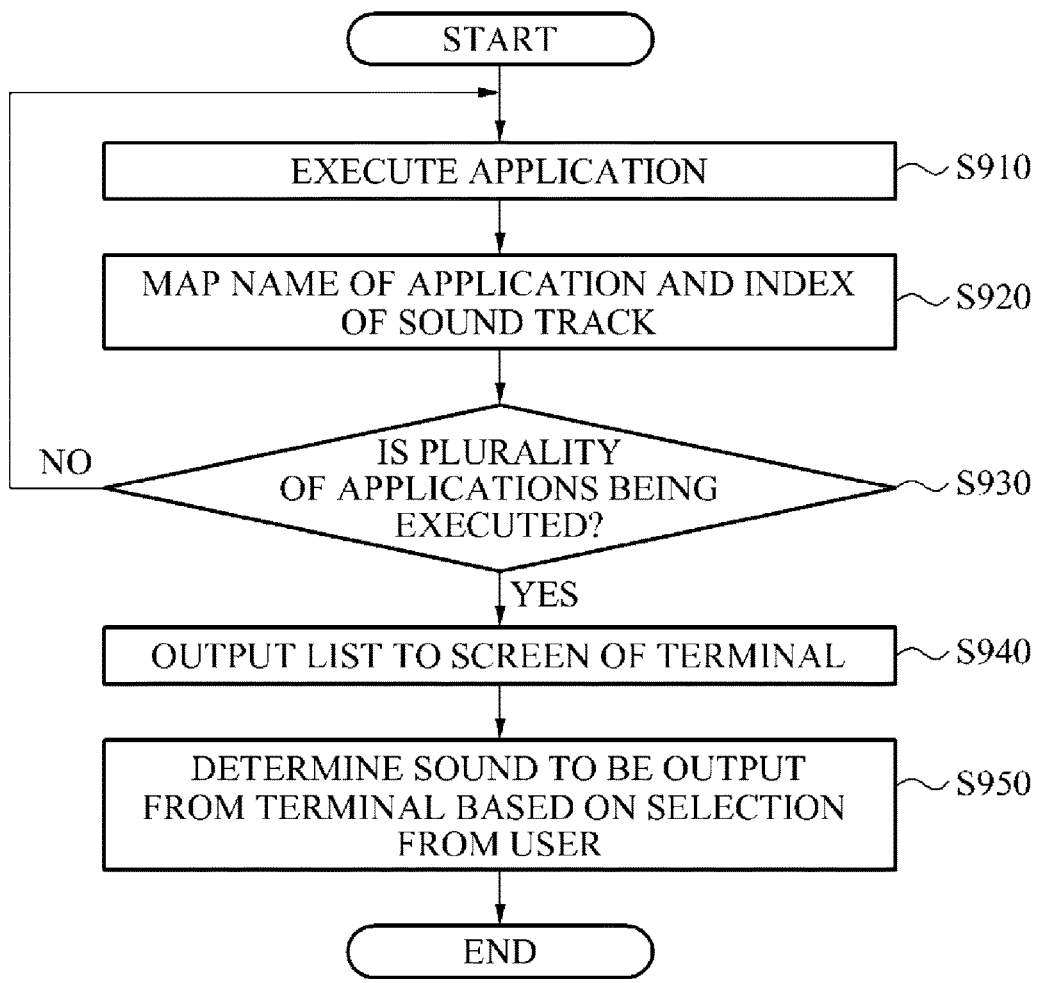
FIG. 9 illustrates a method for controlling an output sound of a mobile terminal according to exemplary embodiments of the present invention.

FIG. 9 illustrates a method for controlling an output sound of a mobile terminal according to exemplary embodiments of the present invention. In operation S910, when an application is executed in a mobile terminal, a name of the application being executed and an index of a soundtrack may be mapped in operation S920. The soundtrack may include information about a sound being played in the application, and the index may be set for each soundtrack. The soundtrack may include decoded sound information being played in the application.

In operation S930, a sound control unit (not shown) may determine whether a plurality of applications is being executed. As the name of the application and the index of the soundtrack matched to the name of the application are stored in a mapping information storing unit (not shown), whether a plurality of applications playing sounds are being executed may be determined by verifying a number of applications stored in the mapping information storing unit or a number of indices of the soundtracks.

When a plurality of applications playing sound are being executed (the "YES" branch of operation S930), a list of corresponding applications may be output to the screen of the mobile terminal in operation S940, and the user may select a desired application to play a sound from the list. When a plurality of audio applications are not being executed (the "NO" branch of operation S930), the system continues with executing the application in operation S910. In operation S950, an output sound from the terminal may be finally determined based on the selection from the list.

The exemplary embodiments according to the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM discs and DVD; magneto-optical media such as floptical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A mobile terminal to control an output sound, the mobile terminal comprising:
    a sound control unit configured to form a virtual output path for applications requesting to output sound data and configured to determine sound data to be output selected from each application's sound data;
    a mapping information storing unit configured store a priority associated with each of the applications that is set by a user for execution of the applications, and to map and store application identifiers for the applications to a sound track index;
    a sound output unit configured to output the determined sound data by muting the virtual output paths not mapped to the determined sound data based on the priority of the applications and without further user input; and
    a sound hardware controlled by the sound output unit.

2. The mobile terminal of claim 1, wherein the sound control unit determines whether a first application of the applications is playing a sound different from the sound being played by a second application of the applications already being executed by verifying whether the first application of the applications is mapped in the mapping information storing unit.

3. The mobile terminal of claim 1, further comprising a sound control interface configured to indicate a selection of one or more applications from the applications, wherein the sound data of the selected one or more applications is output.

4. The mobile terminal of claim 3, wherein the sound control interface comprises a service application executing in an application layer.

5. The mobile terminal of claim 1, wherein the sound control unit determines a sound played in a most recently executed application from the applications that outputted a sound.

6. The mobile terminal of claim 1, further comprising a telephone application, wherein the priority of each of the applications is less than a priority of the telephone application.

7. The mobile terminal of claim 1, further comprising a sound mixer, wherein the virtual path is established prior to the determined sound data being received by the sound mixer.

8. The mobile terminal of claim 1, wherein the sound control unit automatically selects a next determined sound data for the sound output unit.

9. A computer-implemented method for controlling output sound, the method comprising:
  forming a virtual output path for applications requesting to output sound data;
  storing a priority associated with each of the applications that is set by a user for execution of the applications;
  storing mapping information mapping application identifiers for the applications requesting to output sound data to a sound track index;
  determining, with the computer, sound data to be output selected from sound data of the applications based on the priority of the applications and without further user input; and
  outputting, with the computer, the determined sound data by muting the virtual output paths not mapped to the determined sound data.

10. The method of claim 9, further comprises determining whether a first application of the applications is playing a sound different from the sound being played by a second application of the applications already being executed by verifying whether the first application of the applications is mapped in the mapping information.

11. The method of claim 9, further comprising receiving an indication of a selection of one or more applications from the applications, wherein the sound data of the selected one or more applications is output.

12. The method of claim 11, wherein the receiving comprises receiving an application indication from a service application executing in an application layer.

13. The method of claim 9, further comprising determining a sound played in a most recently executed application from the applications that outputted a sound.

14. The method of claim 9, further comprising providing a telephone application, wherein the priority of each of the applications is less than a priority of the telephone application.

15. The method of claim 9, further comprising mixing sound data, wherein the virtual path is established prior to the determined sound data being received by the mixing sound data operation.

16. The method of claim 9, further comprising automatically selecting a next determined sound data for the outputting.

* * * * *